United States Patent

Tu et al.

(10) Patent No.: US 8,976,167 B2
(45) Date of Patent: *Mar. 10, 2015

(54) DRIVING CIRCUIT AND DRIVING CONTROLLER CAPABLE OF ADJUSTING INTERNAL IMPEDANCE

(71) Applicant: AU Optronics Corp., Hsin-Chu (TW)

(72) Inventors: Ming-Hung Tu, Hsin-Chu (TW); Sheng-Kai Hsu, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 165 days.

This patent is subject to a terminal disclaimer.

(21) Appl. No.: 13/685,825

(22) Filed: Nov. 27, 2012

(65) Prior Publication Data

US 2013/0082745 A1    Apr. 4, 2013

Related U.S. Application Data

(63) Continuation of application No. 12/356,517, filed on Jan. 20, 2009, now Pat. No. 8,405,651.

(30) Foreign Application Priority Data

May 9, 2008   (TW) .................................. 097117203

(51) Int. Cl.
  *H03K 3/00*  (2006.01)
  *G09G 3/36*  (2006.01)
(52) U.S. Cl.
  CPC ................ *H03K 3/00* (2013.01); *G09G 3/3696* (2013.01); *G09G 2320/0233* (2013.01)
  USPC ............................. 345/214; 345/94; 345/55
(58) Field of Classification Search
  CPC .................. G09G 3/36; G09G 2320/0233
  USPC ................................. 345/214, 94, 55
  See application file for complete search history.

(56) References Cited

U.S. PATENT DOCUMENTS

| 4,034,232 | A | 7/1977 | LaVenture |
| 6,841,982 | B2 | 1/2005 | Tran |
| 6,980,022 | B1 | 12/2005 | Shumarayev et al. |
| 7,164,405 | B1 * | 1/2007 | Jeong et al. ....................... 345/94 |
| 2008/0239184 | A1 * | 10/2008 | Kim et al. ......................... 349/41 |
| 2008/0246703 | A1 | 10/2008 | Smith |

FOREIGN PATENT DOCUMENTS

| KR | 10-2005-0118873 A | 12/2005 |
| TW | 200715256 A | 4/2007 |

* cited by examiner

*Primary Examiner* — William Boddie
*Assistant Examiner* — Leonid Shapiro
(74) *Attorney, Agent, or Firm* — WPAT, PC; Justin King

(57) ABSTRACT

A driving circuit includes a power supply, a plurality of conductive paths and a plurality of driving controller. The power supply is configured for providing a predetermined voltage. The conductive paths are connected to the power supply to receive the predetermined voltage. The driving controllers are connected to the conductive paths correspondingly. A first driving controller of the driving controllers has a first internal circuit configured for employing an internal voltage to perform functions provided by the first driving controller, and a resistance adjustment unit. The resistance adjustment unit is connected between a special conductive path and the first internal circuit. The second driving controller has a second internal circuit configured for employing a second internal voltage to perform functions provided by the second driving controller. A resistance value of the resistance adjustment unit is adjustable to make the first internal voltage same to the second internal voltage.

7 Claims, 6 Drawing Sheets

DRIVING CIRCUIT AND DRIVING CONTROLLER CAPABLE OF ADJUSTING INTERNAL IMPEDANCE

CROSS-REFERENCE TO RELATED APPLICATIONS

This is a continuation application of an application Ser. No. 12/356,517, filed Jan. 20, 2009 which is based upon and claims the benefit of priority from the prior Taiwanese Patent Application No. 097117203, filed May 9, 2008, the entire contents of which are incorporated herein by reference.

FIELD OF THE INVENTION

The present invention relates to a driving circuit, and more particularly, to a driving circuit adapted to a liquid crystal display panel and a driving controller capable of adjusting internal impedance thereof.

BACKGROUND OF THE INVENTION

Generally, a typical thin film transistor liquid crystal display (TFT-LCD) includes an upper panel having a color filter, a lower panel and liquid crystal filled between the upper panel and the lower panel. A plurality of scanning lines (gate lines) and a plurality of data lines (source lines) crossed above the plurality of scanning lines, are formed on the lower panel. A plurality of thin film transistors (TFT) arranged in an array, are adjacent to intersections defined by the scanning lines and the data lines respectively. Each TFT is configured for determining whether or not transmit a data signal of the corresponding data line electrically connected to this TFT, to a corresponding pixel, according to a controlling signal of the corresponding scanning line electrically connected to this TFT. Therefore, each TFT is used as a switch for the corresponding pixel.

FIG. 1 is a circuit block diagram of a typical liquid crystal display (LCD) panel. As shown in FIG. 1, a TFT-LCD panel 10 includes a board 12, a printed circuit board 14 and a plurality of flexible printed circuit boards 16. The flexible printed circuit boards 16 are electrically coupled between the printed circuit board 14 and the board 12. The printed circuit board 14 includes essential electronic members, such as a power supply (not shown) and a time controller (not shown), etc., formed thereon. A plurality of scanning lines GL1, GL2, ... GLm, and a plurality of data lines DL1, DL2, ... DLn, are formed on the board 12. The plurality of scanning lines GL1, GL2, ... GLm, are crossed above or below the plurality of data lines DL1, DL2, ... DLn, to define a pixel array in an active region 122 of the board 12. A plurality of source driving controllers 18 are arranged on a periphery region of the board 12 electrically connected to the flexible printed circuit boards 16. The source driving controllers 18 are electrically connected to the flexible printed circuit boards 16 for receiving data signals to drive the data lines DL1, DL2, ... DLn. Similarly, a plurality of scanning driving controllers 22 are arranged on another periphery region of the board 12 for receiving control signals to drive the scanning lines GL1, GL2, ... GLm.

The power supply of the printed circuit board 14 provides power voltages (for example, analog power voltages) to the source driving controllers 18 and the scanning driving controllers 22 via conductive paths 19 and 23, respectively. The conductive paths 19 and 23 are formed directly on the surface of the board 12, those called as a mode of wiring on array (WOA). As shown in FIG. 1, the conductive path 19 provides the power voltages to the source driving controllers 18 in a cascade frame, such that the power voltages are transmitted along a single direction. However, if the mode of wiring on array is used in the board 12 made of glass, the resistance of the wires is high and a large change of the voltage drop is produced. Therefore, the plurality of flexible printed circuit boards 16 should be employed, for solving the problem in relation to the differences of the input voltages (working voltages) of the source driving controllers 18 in the cascade frame. If the plurality of flexible printed circuit boards 16 are employed, the conductive path 19 will not be too long and the change of the voltage drop is decreased.

However, the manufacturing cost is high since employing the plurality of flexible printed circuit board. To decrease the manufacturing cost, there should have as few flexible printed circuit boards (for example, only one flexible printed circuit board) as possible. Furthermore, the input voltages of the driving controllers should be substantially same.

What is needed is providing a driving circuit, which can solve the above problems.

SUMMARY OF THE INVENTION

A driving circuit in accordance with an exemplary embodiment of the present invention is provided. The driving circuit includes a power supply, a plurality of conductive paths and a plurality of driving controller. The power supply provides a predetermined voltage. The conductive paths are electrically connected to the power supply to receive the predetermined voltage. Each driving controller is electrically connected to one corresponding conductive path. The driving controllers at least include a first driving controller and a second driving controller. The first driving controller has a first internal circuit and a resistance adjustment unit. The first internal circuit employs a first internal voltage to perform functions that should be provided by the first driving controller. The resistance adjustment unit is electrically connected between a special conductive path of the conductive paths and the first internal circuit. The second driving controller has a second internal circuit for employing a second internal voltage to perform functions that should be provided by the second driving controller. A resistance value of the resistance adjustment unit is adjustable to make the first internal voltage same to the second internal voltage.

A driving controller capable of adjusting an internal impedance thereof in accordance with another exemplary embodiment of the present invention is provided. The driving controller includes an internal circuit and a resistance adjustment unit. The internal circuit is configured for employing an internal voltage to perform functions that should be provided by the driving controller. The resistance adjustment unit is electrically connected between a conductive path and the internal circuit, and a resistance value of the resistance adjustment unit is adjustable to adjust the internal voltage by adjusting the resistance value of the resistance adjustment unit.

A driving circuit in accordance with other exemplary embodiment of the present invention is provided. The driving circuit includes a power supply and a plurality of conductive paths and a plurality of driving controller. The power supply provides a predetermined voltage. The conductive paths are electrically connected to the power supply to receive the predetermined voltage, and the conductive paths have different resistance values. Each driving controller is electrically connected to a corresponding conductive path. The driving controllers receive same voltages supplied from the conductive paths electrically connected to the driving controllers.

The present invention employs the special circuit designs, such as the internal circuit and/or the external circuit designs of the driving controllers, to compensate the working voltages (the internal voltage or the input voltage) of the driving controllers. Therefore, even if a single flexible printed circuit board is employed to provide the working voltages of the driving controllers, the working voltages of the driving controllers are substantially same.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
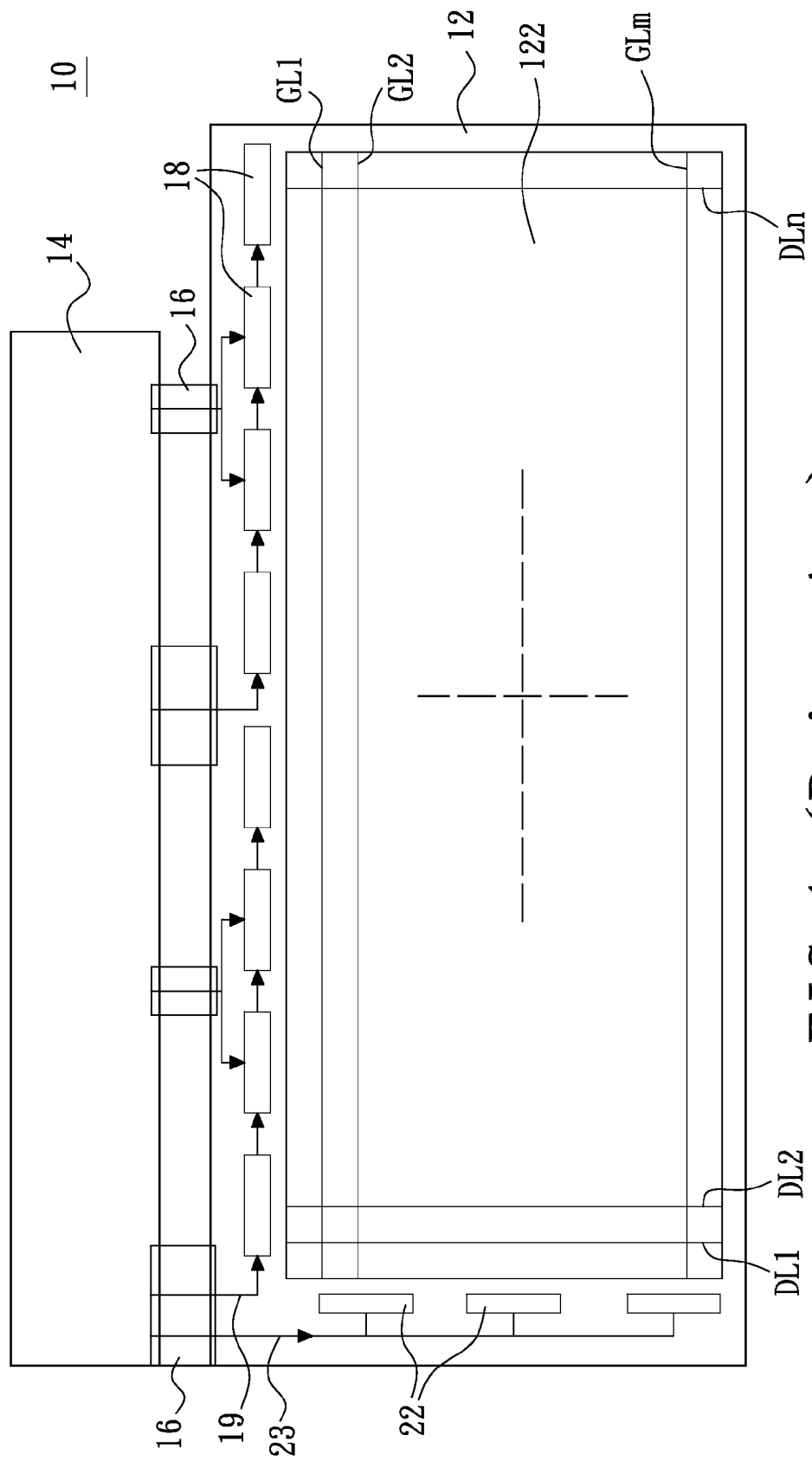
FIG. 1 is a schematic block diagram of a conventional LCD panel.
Figure 2:
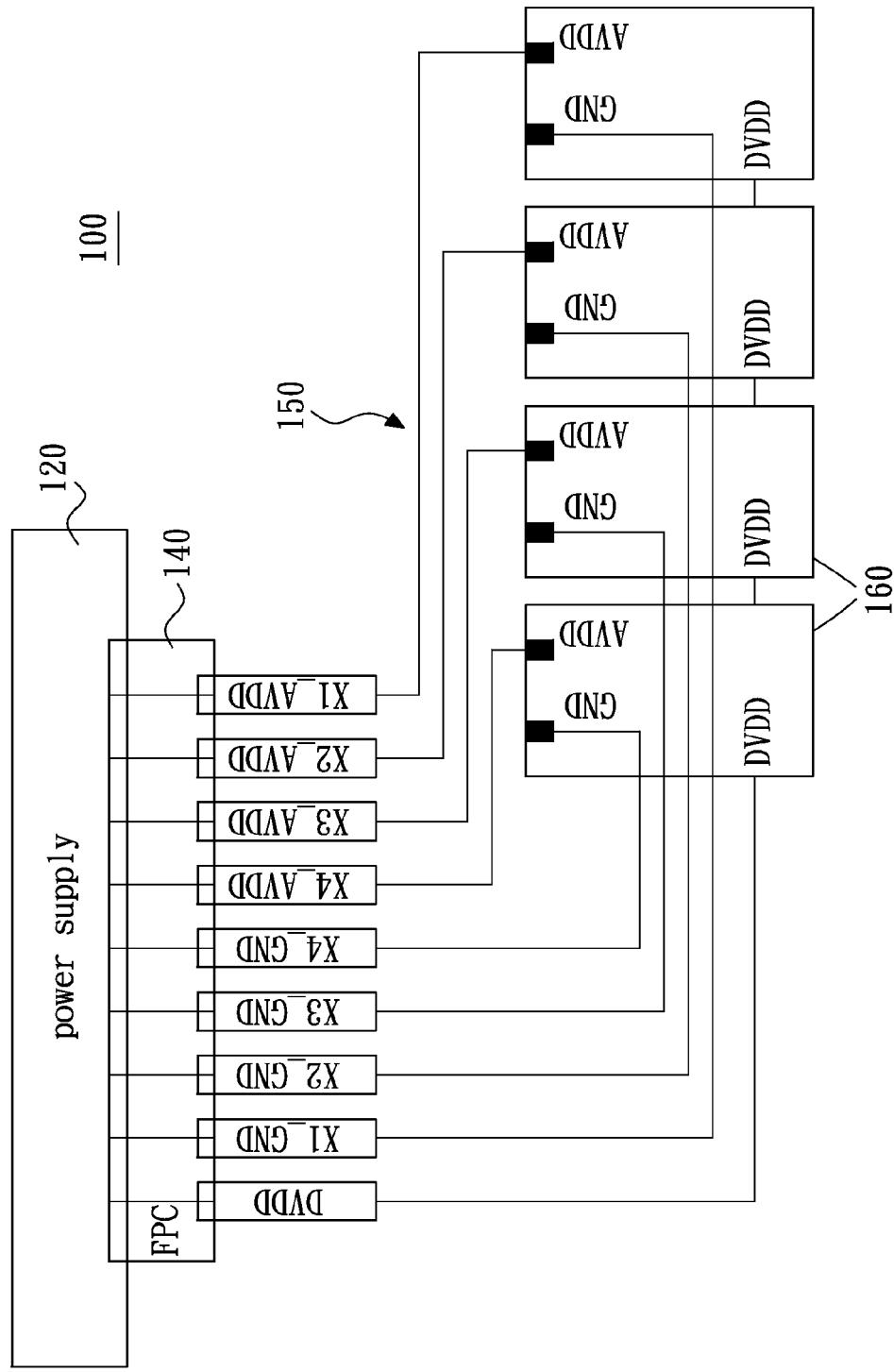
FIG. 2 is a schematic block diagram of a driving circuit in accordance with an exemplary embodiment of the present invention.

Referring to FIG. 2, a driving circuit in accordance with a first exemplary embodiment of the present invention is provided. In this exemplary embodiment, the driving circuit 100 includes a power supply 120, a flexible printed circuit board 140, a plurality of conductive paths 150 and a plurality of driving controllers 160.

The power supply 120 is configured for providing a predetermined voltage. In this exemplary embodiment, the predetermined voltage is a potential difference between analog power terminals Xn_AVDD (n=1~4) and ground terminals Xn_GND (n=1~4). The power supply 120 is also configured for providing a digital power potential DVDD. The power supply 120 is electrically connected to the driving controllers 160 through the flexible printed circuit board 140 and the conductive paths 150. Concretely, analog power terminals (AVDD) and ground terminals (GND) of the driving controllers 160 are electrically connected to the analog power terminals Xn_AVDD and the ground terminals Xn_GND via the corresponding conductive paths 150, respectively. The driving controllers 160 may be integrated circuits. Digital power terminals (DVDD) of the driving controllers 160 receive the digital power potential DVDD provided from the power supply 120 in a cascading mode.

Figure 3:
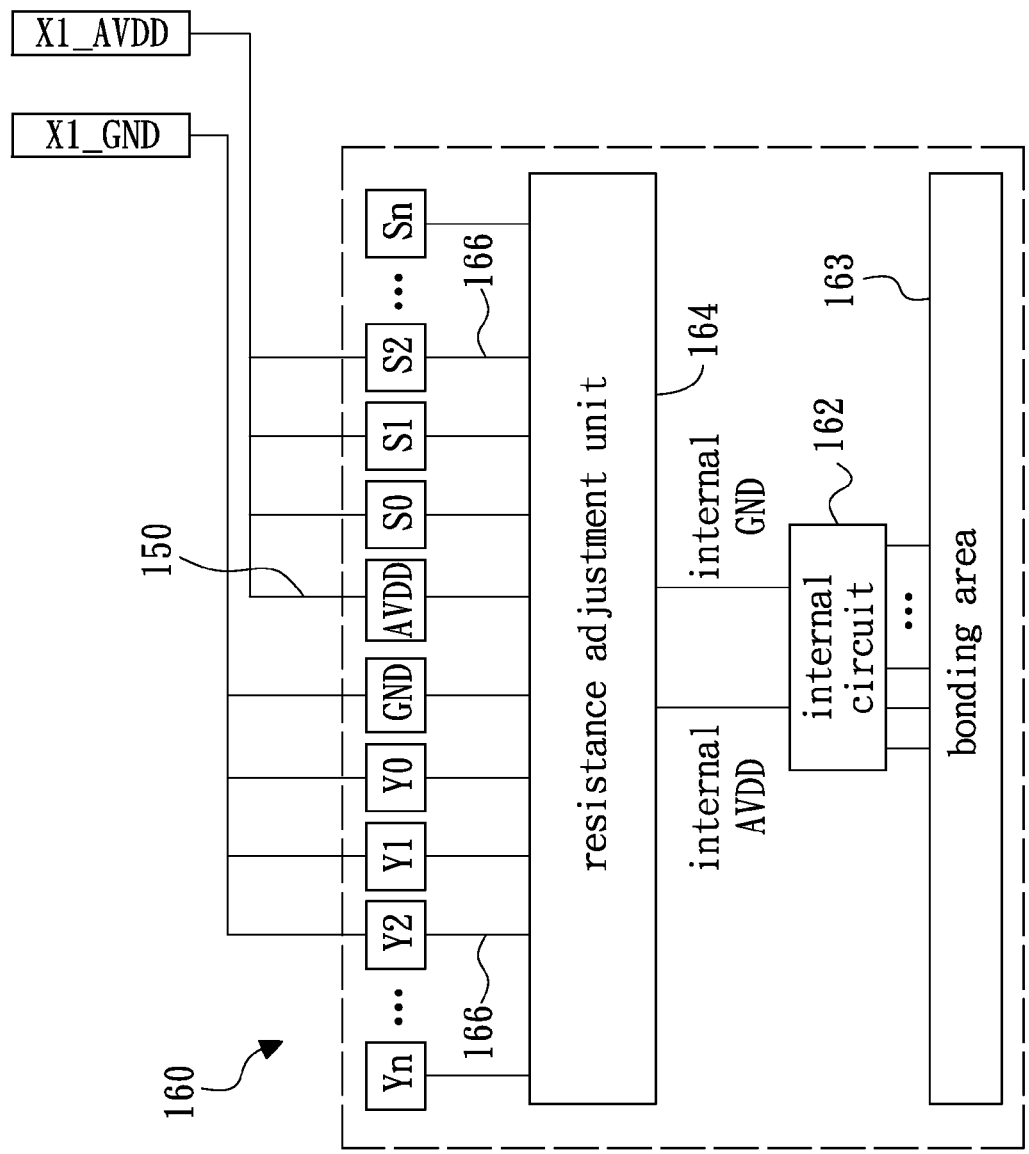
FIG. 3 is a schematic block diagram of a driving controller in accordance with an exemplary embodiment of the present invention.

Referring to FIG. 3, a driving controller in accordance with an exemplary embodiment of the present invention is provided. As shown in FIG. 3, each driving controller 160 includes an internal circuit 162, a bonding area 163, a plurality of resistance adjustment units 164, a plurality of first adjustment pads Y0, Y1, Y2, . . . Yn, a plurality of second adjustment pads S0, S1, S2, . . . Sn, and a plurality of resistance adjustment circuits 166. The internal circuit 162 employs an internal voltage (working voltage), which is a potential difference between an internal potential AVDD sent from the power terminal and an internal potential GND sent from the ground terminal, to make the driving controller 160 perform its functions. Various signals produced from the internal circuit 162 are sent out of the driving controller 160 via the bonding area 163. Each resistance adjustment unit 164 is electrically connected between a corresponding conductive path 150 and the internal circuit 162, such that the driving controller 160 can employ the resistance adjustment unit 164 to adjust the internal potential AVDD and the internal potential GND. In this exemplary embodiment, some first adjustment pads Y0, Y1 and Y2 are electrically connected to the ground terminal X1_GND of the power supply 120, and some second adjustment pads S0, S1 and S2 are electrically connected to the analog terminal X1_AVDD of the power supply 120. Other first and second adjustment pads not used are spare.

It should be noted that, in all first adjustment pads Y0, Y1, Y2 . . . Yn, which used to be electrically connected to the analog terminal X1_AVDD, are determined by the internal potential AVDD of the power terminal of the internal circuit 162. There may be one or some first adjustment pads electrically connected to the analog terminal X1_AVDD. Similarly, in all second adjustment pads S0, S1, S2 . . . Sn, which used to be electrically connected to the ground terminal X1_GND, are determined by the internal potential GND of the ground terminal of the internal circuit 162. One terminal of each resistance adjustment circuit 166 is electrically connected to one corresponding first or second adjustment pad Y0, Y1, Y2, . . . Yn or S0, S1, S2, . . . Sn. Another terminal thereof is electrically connected to the resistance adjustment unit 164. In this exemplary embodiment, the resistance adjustment circuits 166 are simple conductive wires, and the amount thereof is same to that of the first and second adjustment pads.

Figure 4:
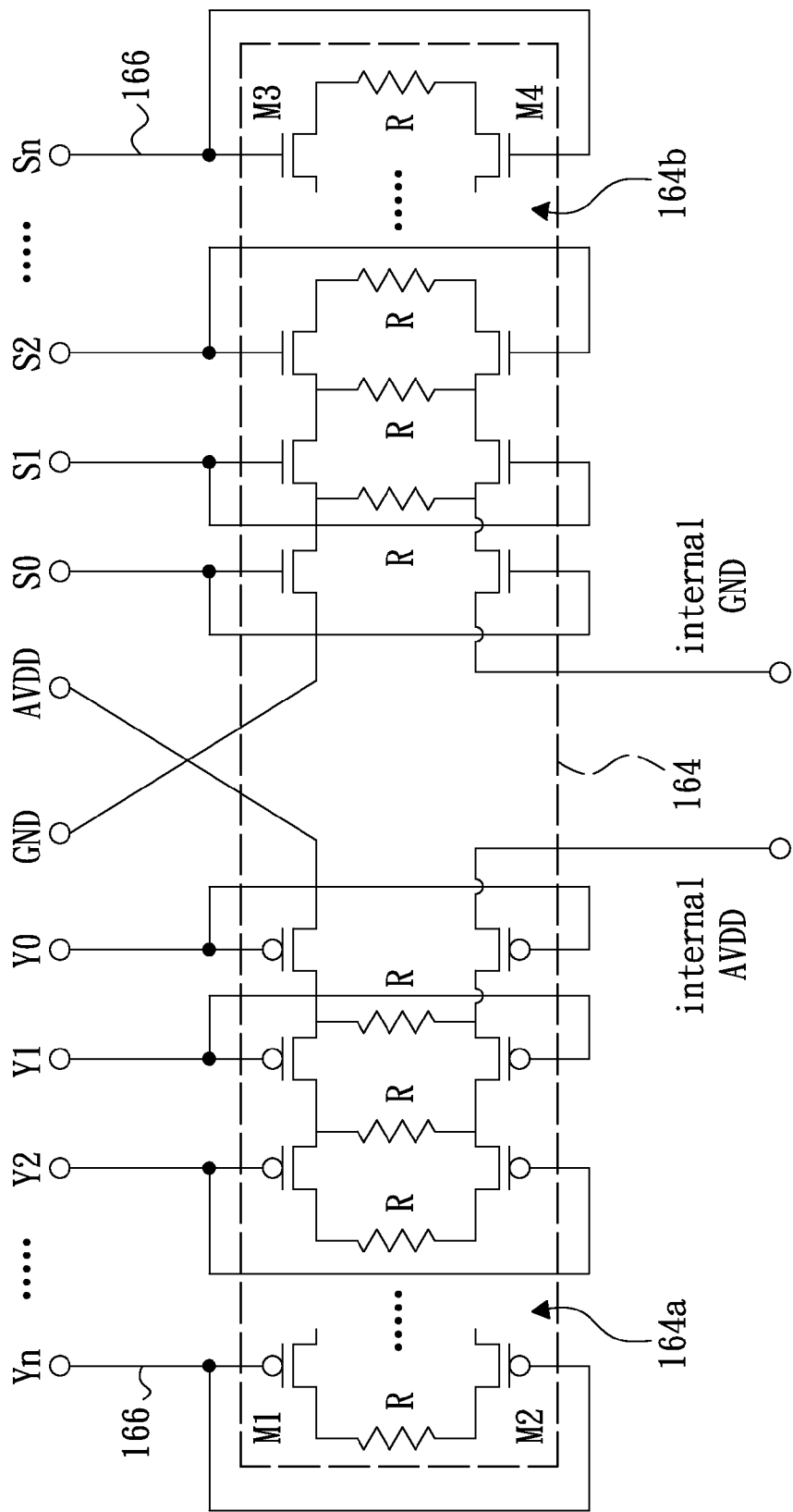
FIG. 4 is a schematic diagram of a resistance adjustment unit in accordance with an exemplary embodiment of the present invention.

Referring to FIG. 4, the resistance adjustment unit in accordance with an exemplary embodiment of the present invention is provided. As shown in FIG. 4, the resistance adjustment unit 164 includes a first resistance adjustment unit 164a and a second resistance adjustment unit 164b. The first resistance adjustment unit 164a is electrically connected to the adjustment pad AVDD to obtain a potential supplied from the analog power terminal X1_AVDD through the conductive path 150. The first resistance adjustment unit 164a includes a plurality of transistors M1, a plurality of transistors M2 and a plurality of resistors R. The adjacent transistors M1 are connected together in series. Similarly, the adjacent transistors M2 are connected together in series. The resistors R are electrically connected between the transistors M1 and the corresponding transistors M2 respectively, such that the whole resistance value represented by the conductive path 150 may be adjusted by turning on or off the transistors M1 and M2 to change combination of the resistors R. Thus the internal potential AVDD may be adjusted correspondingly.

In this exemplary embodiment, the second resistance adjustment unit 164b is electrically connected to the adjustment pad GND to obtain a potential provided from the ground terminal X1_GND through the conductive path 150. The second resistance adjustment unit 164b includes a plurality of transistors M3, a plurality of transistors M4 and a plurality of resistors R. The adjacent transistors M3 are connected together in series. Similarly, the transistors M4 are connected together in series. The resistors R are electrically connected between the transistors M3 and the corresponding transistors M4 respectively, such that the whole resistance value represented by the conductive path 150 may be adjusted by turning on or off the transistors M3 and M4 to change combination of the resistors R. Thus the internal potential GND may be adjusted correspondingly.

It should be noted that, in this exemplary embodiment, the transistors M1 and M2 are p-type transistors and the transistors M3 and M4 are n-type transistors, however the present invention is not limited in those. One skilled in the art could devise variations that are within the scope and spirit of the invention disclosed herein, including selecting different elements and changing designs of the adjustment circuit. Furthermore, although the resistors R of this exemplary embodiment are same, they also may be different under needs.

From the above, one terminal of each resistance adjustment circuit 166 electrically connected to the resistance adjustment unit 164, is coupled to gate terminals of the corresponding transistors M1 and M2 or the transistors M3 and M4, such that the resistance adjustment circuit 166 can be used to transmit predetermined potentials, such as the potentials provided from the analog power terminal X1_AVDD or the ground terminal X1_GND, to control on/off states of the transistors electrically connected to this resistance adjustment circuit 166. Thus the driving controller 160 is capable of internal impedance thereof.

It should be noted that, the resistance adjustment unit 164 of the driving controller 160 is configured for adjusting the internal potential AVDD and the internal potential GND of the internal circuit 162 to adjust the internal voltage (the difference between the internal potential AVDD and the internal potential GND) of the internal circuit 162. Of course, the resistance adjustment unit 164 is designed to only adjust the internal potential AVDD or the internal potential GND to adjust the internal voltage. Furthermore, if only adjusting the internal potential AVDD, the resistance adjustment unit 164 only includes the first resistance adjustment unit 164a electrically connected to the analog power terminal Xn_AVDD of the power supply 120, to adjust the internal potential AVDD. Simultaneously, the ground terminal (an input terminal for the internal potential GND) of the internal circuit 162 is connected directly to the ground terminal Xn_GND of the power supply 120. Similarly, if only adjusting the internal potential GND, the resistance adjustment unit 164 only includes the second resistance adjustment unit 164b electrically connected to the ground terminal Xn_GND of the power supply 120, to adjust the ground potential GND. Simultaneously, the power terminal (an input terminal for the internal potential AVDD) of the internal circuit 162 is connected directly to the analog terminal Xn_AVDD of the power supply 120.

The present driving circuit 100 changes the internal impedances of the driving controllers, such that the driving controllers 160 can have same internal potentials. The driving controllers 160 of the driving circuit 100 may have same internal circuit frames. For example, each driving controller 160 includes the internal circuit 162 and the resistance adjustment unit 164 as shown in FIG. 3. Alternatively, the driving controllers 160 of the driving circuit 100 may have difference internal circuit frames. For example, some driving controllers, each includes the internal circuit 162 and the resistance adjustment unit 164 as shown in FIG. 3, and some driving controllers, each only includes the internal circuit 162 without the resistance adjustment unit 164. Of course, the present invention may include other variations. For example, some driving controllers 160, each only includes the resistance adjustment circuit 164a without the resistance adjustment circuit 164b; some driving controllers 160, each only includes the resistance adjustment circuit 164b without the resistance adjustment circuit 164a; and other driving controllers 160, each includes the resistance adjustment circuit 164a and the resistance adjustment circuit 164b. In other words, variations may be employed if they can make the driving controllers of the driving circuit 100 have same internal voltages.

Figure 5:
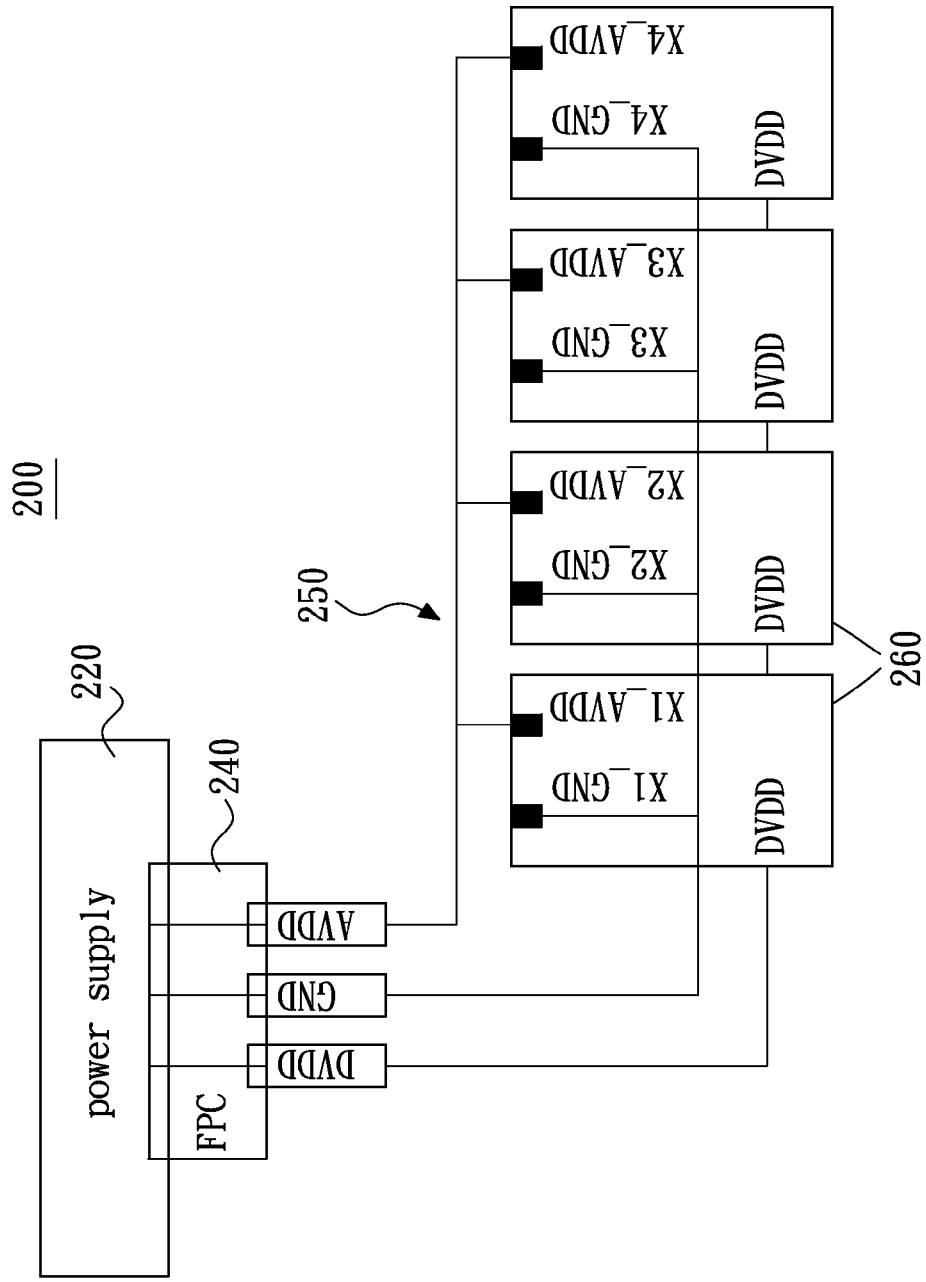
FIG. 5 is a schematic block diagram of a driving circuit in accordance with another exemplary embodiment of the present invention.

Referring to FIG. 5, a driving circuit in accordance with a second exemplary embodiment of the present invention is provided. In this exemplary embodiment, the driving circuit 200 includes a power supply 220, a flexible printed circuit board 240, a conductive path 250 and a plurality of driving controllers 260. The present driving circuit 200 compensates external impedance of the driving controllers to make the driving controllers 260 have same potentials. The power supply 220 is configured for providing a predetermined voltage through the flexible printed circuit board 240. In this exemplary embodiment, the predetermined voltage is the potential difference between an analog power terminal AVDD and a ground terminal GND. The power supply is also configured for providing a digital power potential DVDD. The analog power terminal AVDD and the ground terminal GND are configured for making analog power terminals and ground terminals of the driving controllers 260 have same potential differences (voltage) via the conductive path 250. In other words, the conductive path 250 is designed to make the analog power terminals X1_AVDD, X2_AVDD, X3_AVDD and X4_AVDD and the corresponding ground terminals X1_GND, X2_GND, X3_GND and X4_GND produce same potential differences therebetween.

Figure 6:
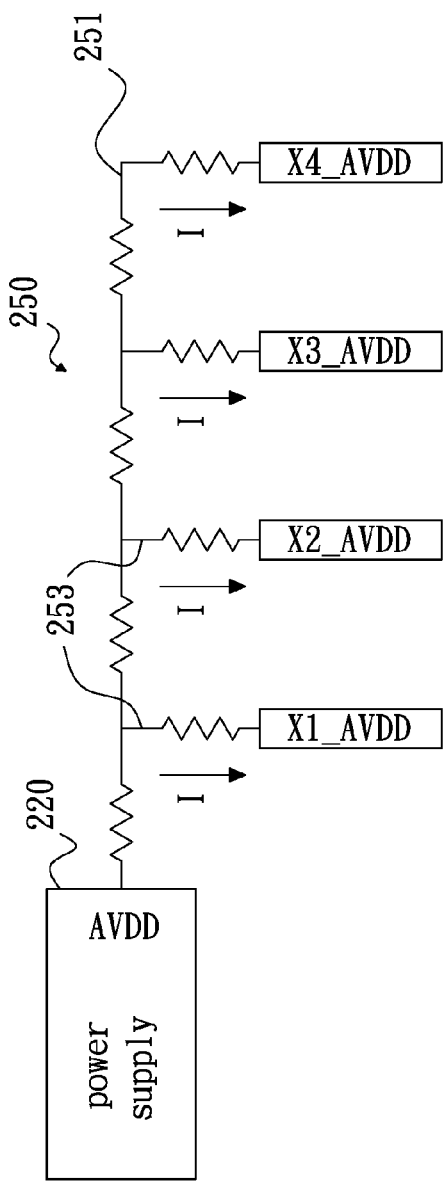
FIG. 6 is a schematic diagram of a circuit for adjusting analog power potentials in accordance with another exemplary embodiment of the present invention.

Refer to FIGS. 5 and 6 together. FIG. 6 is a circuit diagram for adjusting the analog power terminals X1_AVDD, X2_AVDD, X3_AVDD and X4_AVDD of the driving controllers 260 as shown in FIG. 5 by a plurality of conductive path 250. The conductive paths 250 are formed on the glass board, and include a main conductive path 251 and a plurality of accessorial conductive paths 253. The main conductive path 251 is electrically connected to the analog power terminal AVDD of the power supply 220 to receive a predetermined analog power potential. For the accessorial conductive paths 253, one terminal of each of the accessorial conductive paths 253 is electrically connected to different nodes of the main conductive path 251 respectively, and another terminal thereof is electrically connected to the analog power terminals X1_AVDD, X2_AVDD, X3_AVDD and X4_AVDD of the driving controllers 260 respectively as shown in FIG. 5.

In this exemplary embodiment, if resistance values between the adjacent nodes of the main conductive path 251 and a resistance value between a first node adjacent to the power supply 220 and the power supply 220 are R, currents I passed through the accessorial conductive paths 253 are same. In addition, an accessorial conductive path 253 (called as a first accessorial conductive path in following) adjacent to the power supply 220 is electrically connected to a first node of the main conductive path 251, and an accessorial conductive path (call as a second accessorial conductive path in following) far away from the power supply 220 is electrically connected to a second node of the main conductive path 251. If the first accessorial conductive path has a resistance value of R1, the second accessorial conductive path has a resistance value of R2, to achieve same potentials and same currents at the analog power terminals X1_AVDD, X2_AVDD, X3_AVDD and X4_AVDD of the driving controllers 260, R1 and R2 must satisfy a following equation:

$$R_2 = R_1 - \frac{n*(n-1)}{2}*R$$

Wherein n is the amount of the nodes. Other accessorial conductive paths are electrically connected to the main conductive path 251 to form n−2 nodes between the first node and the second node. The resistance value between the second node and the power supply 220 is n*R.

For example, as shown in FIG. 6, two (n=4) accessorial conductive paths 253 are arranged between the first accessorial conductive path and the second accessorial conductive path, and the two accessorial conductive paths 253 are electrically connected to the main conductive path 251 respectively to form two nodes. The resistance value between the second node and the power supply 220 is 4R. R1 equals to 7R, and R2 equals to R. Furthermore, the two accessorial conductive paths arranged between the first accessorial conductive path and the second accessorial conductive path, have resistance values of 4R and 2R respectively. That is, in this exemplary embodiment, the resistance values of the conductive paths are different to achieve same potentials at the analog power terminals X1_AVDD, X2_AVDD, X3_AVDD and X4_AVDD of the driving controllers 260 as shown in FIG. 5.

Figure 7:
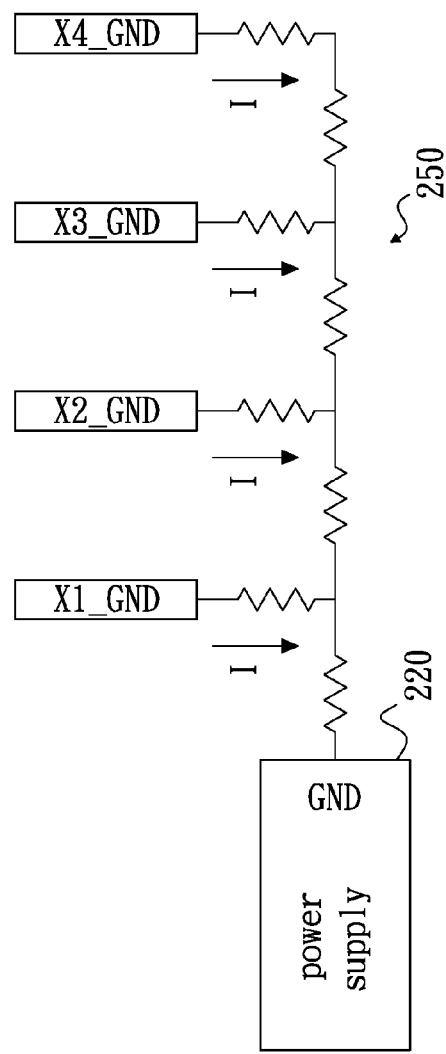
FIG. 7 is a schematic diagram of a circuit for adjusting ground potentials in accordance with another exemplary embodiment of the present invention.

Refer to FIGS. 5 and 7. FIG. 7 is a circuit diagram for adjusting the ground terminals X1_GND, X2_GND, X3_GND and X4_GND of the driving controllers 260 as shown in FIG. 5 with same potentials by the plurality of conductive paths 250. Similarly, the conductive paths 250 are formed on the glass board, and include a main conductive path and a plurality of accessorial conductive paths. The main conductive path is electrically connected to the ground terminal GND of the power supply 220 to receive a predetermined ground potential. One terminals of the accessorial conductive path are electrically connected to different nodes of the main conductive path respectively; and another terminals thereof are electrically connected to the ground terminals X1_GND, X2_GND, X3_GND and X4_GND of the driving controllers 260 as shown in FIG. 5.

The resistance values of the conductive paths 250 as shown in FIG. 7 are same to those as shown in FIG. 6. The conductive paths 250 have different resistance values such that the ground terminals X1_GND, X2_GND, X3_GND and X4_GND of the driving controllers 260 have same potentials.

From FIGS. 6 and 7, since the analog power terminals X1_AVDD, X2_AVDD, X3_AVDD and X4_AVDD have the same potentials, the ground terminals X1_GND, X2_GND, X3_GND and X4_GND also have the same potentials, the conductive paths 250 electrically connected to the driving controllers 260 have the same voltages.

The driving circuit 200 of this exemplary embodiment, adjusts the potentials of the power terminals and the ground terminals of the driving controllers 260 such that the input voltages of the driving controllers 260 are same. It should be noted that, this adjusting mode may be cooperated with the adjusting mode as shown in FIGS. 2 to 4.

From the above, those above embodiments of the present invention employ the special circuit designs, such as the internal circuit and/or the external circuit designs of the driving controllers, to compensate the working voltages (the internal voltage or the input voltage) of the driving controllers. Therefore, even if a single flexible printed circuit board is employed to provide the working voltages of the driving controllers, the working voltages of the driving controllers are substantially same.

Furthermore, the present driving circuits of the present invention may be adapted in a TFT-LCD panel. The driving controllers of the driving circuit may be data driving controllers for driving data lines. It may be understood that, the driving controllers of the driving circuit also may be scan driving controllers for driving scanning lines. Of course, the present driving circuits of the present invention may be not adapted in the TFT-LCD panel, and may be adapted in other planar display panel.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A driving circuit, comprising:
a power supply for providing a predetermined voltage;
a plurality of conductive paths electrically connected to the power supply to receive the predetermined voltage, and the conductive paths having different resistance values; and
a plurality of driving controllers, each of the driving controllers being electrically connected to one corresponding conductive path, and the driving controllers receiving same voltages supplied from the conductive paths,
wherein the conductive paths includes:
a main conductive path electrically connected to the power supply to receive the predetermined voltage; and
a plurality of accessorial conductive paths, one terminals of the accessorial conductive paths being electrically connected to different nodes formed on the main conductive path respectively, and another terminals thereof being electrically connected to the driving controllers respectively,
wherein the accessorial conductive paths comprises:
a first accessorial conductive path, one terminal thereof being electrically connected to a first node of the main conductive path, the first node being one of the nodes that is most adjacent to the power supply, a resistance value between the first node and the power supply being R, a resistance value of the first accessorial conductive path being R1; and
a second accessorial conductive path, one terminal thereof being electrically connected to a second node formed on the main conductive path, the second node being one of the nodes that is farthest away from the power supply, a resistance value between the second node and the power supply being n*R, a resistance value of the second accessorial conductive path being R2,
wherein, other accessorial conductive paths are electrically connected to the main conductive path to form n−2 nodes, which are between the first node and the second node, and currents passed through the accessorial conductive paths are same, and R1 and R2 satisfy a following equation:

$$R_2 = R_1 - \frac{n*(n-1)}{2}*R.$$

2. The driving circuit as claimed in claim 1, wherein the plurality of driving controllers comprises:
   a first driving controller having a first internal circuit employing a first internal voltage to perform functions provided by the first driving controller, and a resistance adjustment unit electrically connected between a special conductive path of the conductive paths and the first internal circuit; and
   a second driving controller having a second internal circuit employing a second internal voltage to perform functions provided by the second driving controller,
   wherein a resistance value of the resistance adjustment unit is adjustable to make the first internal voltage same to the second internal voltage.

3. The driving circuit as claimed in claim 2, wherein the resistance adjustment unit includes:
   a plurality of first transistors arranged in series;
   a plurality of second transistors arranged in series; and
   a plurality of resistors electrically connected between the first transistors and the second transistors respectively, to change a combination of the resistors such that the special conductive path represents a different resistance value when turning on different combinations of the first transistors and the second transistors.

4. The driving circuit as claimed in claim 1, wherein each of the plurality of driving controllers comprises:
   a internal circuit employing a internal voltage to perform functions provided by the corresponding driving controller; and
   a resistance adjustment unit electrically connected between a special conductive path of the conductive paths and the internal circuit,
   wherein a resistance value of the resistance adjustment unit is adjustable to make the internal voltage same to each of the plurality of driving controllers.

5. The driving circuit as claimed in claim 4, wherein the resistance adjustment unit includes:
   a plurality of first transistors arranged in series;
   a plurality of second transistors arranged in series; and
   a plurality of resistors electrically connected between the first transistors and the second transistors respectively, to change a combination of the resistors such that the conductive path represents a different resistance value when turning on different combinations of the first transistors and the second transistors.

6. The driving circuit as claimed in claim 5, further comprising:
   at least one resistance adjustment circuit, one terminal thereof being electrically connected to gate terminal of at least one of the first transistors and gate terminal of at least one of the second transistors, and another terminal of the resistance adjustment circuit being electrically connected to a predetermined potential, such that the resistance adjustment circuit is configured for transmitting the predetermined potential to control on/off states of the at least one of the first transistors and the at least one of the second transistors electrically connected to the resistance adjustment circuit.

7. A driving circuit, comprising:
   a power supply for providing a predetermined voltage;
   a plurality of conductive paths electrically connected to the power supply to receive the predetermined voltage, and the conductive paths having different resistance values; and
   a plurality of driving controllers, each of the driving controllers being electrically connected to one corresponding conductive path, and the driving controllers receiving same voltages supplied from the conductive paths,
   wherein each of the plurality of driving controllers comprises:
      a internal circuit employing a internal voltage to perform functions provided by the corresponding driving controller; and
      a resistance adjustment unit electrically connected between a special conductive path of the conductive paths and the internal circuit,
      wherein a resistance value of the resistance adjustment unit is adjustable to make the internal voltage same to each of the plurality of driving controllers;
   wherein the resistance adjustment unit includes:
      a plurality of first transistors arranged in series;
      a plurality of second transistors arranged in series; and
      a plurality of resistors electrically connected between the first transistors and the second transistors respectively, to change a combination of the resistors such that the conductive path represents a different resistance value when turning on different combinations of the first transistors and the second transistors;
   wherein the driving circuit further comprises at least one resistance adjustment circuit, one terminal thereof being electrically connected to gate terminal of at least one of the first transistors and gate terminal of at least one of the second transistors, and another terminal of the resistance adjustment circuit being electrically connected to a predetermined potential, such that the resistance adjustment circuit is configured for transmitting the predetermined potential to control on/off states of the at least one of the first transistors and the at least one of the second transistors electrically connected to the resistance adjustment circuit.

* * * * *